United States Patent [19]

Melamed

[11] Patent Number: 4,564,769
[45] Date of Patent: Jan. 14, 1986

[54] SATURATION CONTROL OF A SWITCHING TRANSISTOR

[75] Inventor: Anna Melamed, Nordborg, Denmark

[73] Assignee: Danfoss A/S, Nordborg, Denmark

[21] Appl. No.: 531,340

[22] Filed: Sep. 12, 1983

[30] Foreign Application Priority Data

Oct. 7, 1982 [DK] Denmark .............................. 3237141

[51] Int. Cl.[4] ............................................ H03K 17/64
[52] U.S. Cl. .................................... 307/300; 307/253; 307/270; 307/317 R; 323/289
[58] Field of Search ............... 307/253, 270, 591, 300, 307/317 R; 323/222, 289

[56] References Cited

U.S. PATENT DOCUMENTS

| 3,710,041 | 1/1973 | Hayashi et al. | 307/300 |
| 3,828,208 | 8/1974 | Kelleher | 323/289 X |
| 4,013,903 | 3/1977 | Sakamoto et al. | 307/300 |
| 4,095,127 | 6/1978 | Nerem | 307/300 X |
| 4,321,485 | 3/1982 | Morozowich et al. | 307/300 |
| 4,369,380 | 1/1983 | Menniti et al. | 307/300 X |

OTHER PUBLICATIONS

Fugere et al., "Transformer-Coupled Storage Charge Removal", *IBM Tech. Disc. Bull.*, vol. 14, No. 6, Nov. 1971, p. 1691.

*Primary Examiner*—Stanley D. Miller
*Assistant Examiner*—D. R. Hudspeth
*Attorney, Agent, or Firm*—Wayne B. Easton

[57] ABSTRACT

The invention relates to a base control circuit for a switching transistor in which diodes are utilized to maintain the base-emitter voltage at a higher level than the collector-emitter voltage, upon the turn-on voltage being applied, to minimize switching-on losses while operating to avoid saturation.

2 Claims, 1 Drawing Figure

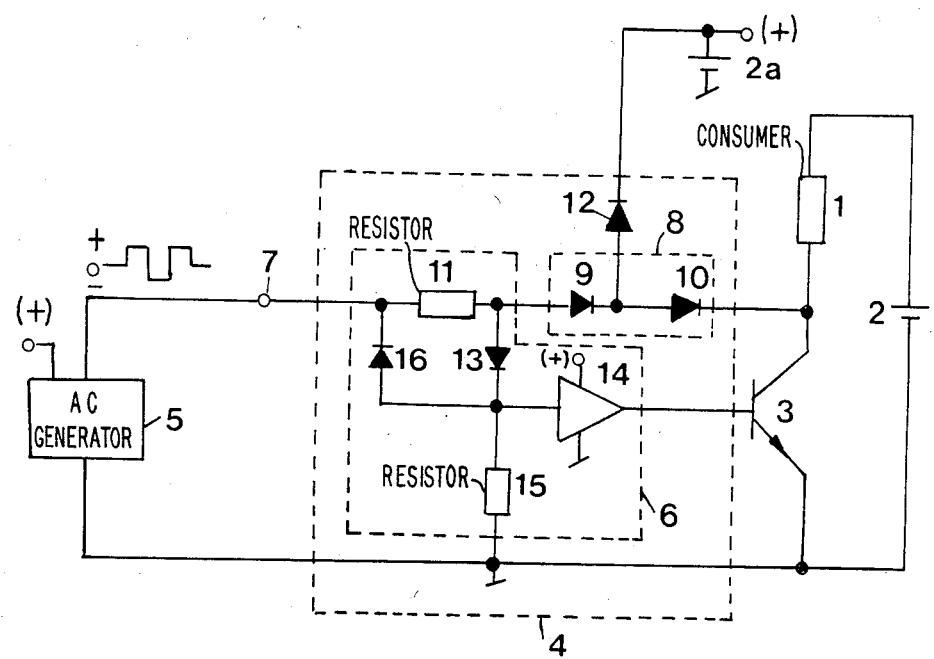

SATURATION CONTROL OF A SWITCHING TRANSISTOR

The invention relates to a control apparatus for a switching transistor comprising a base control circuit which is disposed between a control input of the control apparatus and the base of the switching transistor and by way of which the switching transistor is alternately switchable on and off by a control voltage to switch on and off a consumer which, with the collector-emitter path of the switching transistor, is in series with an operating voltage source, at least one diode in the base control circuit, of which the pass direction is poled in the same sense as that of the base-emitter path of the switching transistor, and a saturation control circuit which is disposed between the control input and the collector of the switching transistor and has at least a first diode of which the pass direction is poled in the same sense as that of the collector-emitter path of the switching transistor.

In a known control apparatus of this kind, the saturation control circuit contains only one anti-saturation diode and the base control circuit likewise contains only one diode, the threshold voltages of these diodes being substantially equal. When applying a switch-on control voltage to the control input of the control apparatus, a current first flows only through the diode of the base control circuit and the base-emitter path of the switching transistor. As soon as modulation with the base current has caused the collector-emitter voltage of the switching transistor to drop to such an extent that it is lower than the control voltage by an amount equal to the threshold voltage of the anti-saturation diode, a current is tapped from the base circuit by way of the anti-saturation diode and the collector-emitter path of the switching transistor so that the modulation (the base current) is reduced but a condition of equilibrium is set up in which the potentials of the base and collector are substantially equal in relation to the emitter. The operating point of the transistor is then just below the saturation kink. By avoiding saturation, not too many charge carriers are stored in the base current of the conductive transistor which would otherwise have to be removed again before the switching transistor can return to the switching-off condition. The switching-off delay period necessitated thereby reduces the overall switching speed of the switching transistor.

To avoid the saturation range still more positively, it is also already known to provide the saturation control circuit with only one anti-saturation diode but the base control circuit with two diodes connected in series in the same sense. In the on condition, the base potential is then lower than the collector potential by the amount of the pass voltage drop of the one diode of the base control circuit in the case of substantially equal threshold voltages for all the diodes.

However, the avoidance of saturation in a switching transistor can involve high switching losses, particularly in switching transistors for high powers and high operating voltages.

The invention is therefore based on the problem of providing a control circuit of the aforementioned kind which ensures low switching-on losses, particularly in a switching transistor for high power and high voltages.

According to the invention, this problem is solved in that the saturation control circuit comprises at least a second diode connected in series with the first in the same sense and that the saturation control circuit is so designed that the base-emitter voltage of the switching transistor is, on applying a switching-on voltage to the control input, higher than the collector-emitter voltage of the switching transistor by about the pass voltage drop of a diode.

In this construction, the switching transistor is necessarily driven up to saturation when switching on. This results in low switching-on losses in the transistor. When the saturation control diodes become conductive, however, part of the base current is withdrawn from the base control circuit. This leads to a limitation of the collector voltage which prevents the switching transistor from being driven too far into saturation. The switching transistor can therefore be switched off again sufficiently rapidly for a power switching transistor, i.e. the storage of an excessively high number of charge carriers in the base chamber is avoided. Use of two diodes connected in series in the same sense in the saturation control circuit additionally ensures that operating voltages can be switched which are higher than the blocking voltage of a normal diode because the sum of the blocking voltages of both diodes determines the level of the permissible operating voltage.

The one diode in the saturation control circuit can be a high voltage diode. This makes still higher operating voltages permissible.

Nevertheless, the second diode of the saturation control circuit can be a (normal) low voltage diode.

If the control apparatus comprises a current amplifier in the base control circuit, it is advantageous for the first diode on the collector side to be a high voltage diode and to provide between the junction of the first and second diodes of the saturation control circuit and the pole of a low voltage source corresponding to the polarity of the collector a diode which is conductive on an overvoltage at the said junction. A high voltage diode has a comparatively high switching capacity which permits voltage leaps or interference pulses to pass. When switching higher voltages, as particularly occur with an operating voltage source for the consumer that produces a high voltage, such voltage leaps or interference pulses can therefore be readily transmitted by way of this switching capacity to the base of the switching transistor. The blocking effect of the second diode can in this case already be of assistance. It is, however, more advantageous to dissipate an overvoltage through a diode between the junction of the first and second saturation control diodes and the low voltage source with simultaneous limitation of the potential of this junction to that of the low voltage source, preferably an operating voltage source of its own for the control apparatus. Such overvoltages can also occur when switching an inductive consumer.

It can be provided that the control voltage is a square AC voltage, that the second diode of the saturation control circuit and the diode in the base control circuit are preceded by a common first resistor, that the diode in the base control circuit precedes the input of the current amplifier, that a second resistor is disposed between the input of the current amplifier and the emitter of the switching transistor, and that a further diode blocking the switching-on control voltage is disposed between the control input of the control apparatus and the current amplifier input. In this construction, the two resistors act as voltage dividers permitting adaptation of the effective control voltage to the respective power transistor. In addition, the diode blocking the switching-on control voltage and the use of a square AC voltage as the control voltage ensure that charge carriers stored in the base chamber in the switched-on condition of the switching transistor are, during switching off, rapidly withdrawn by the switching-off control voltage which acts with reverse polarity in comparison with the switching-on voltage in relation to reference potential (earth). The switching transistor is therefore correspondingly rapidly returned to the switched-off condition.

The invention and its developments will now be described in more detail with reference to the drawing of a preferred example.

The drawing represents a switching transistor 3 for high power applied in series with a consumer 1 to an operating voltage source 2. The base of the transistor is subjected to a control voltage by way of a control apparatus 4 according to the invention comprising a square AC voltage generator 5. The switching transistor 3 therefore alternately switches the consumer 1 or the consumer current on and off. The operating voltage source 2 produces a high voltage of about 600 to 800 Volt as is for example required for operating a 380 V asynchronous motor through an inverse rectifier.

The control apparatus 4 contains a base control circuit 6 between the control input 7 and the base of the switching transistor 3. The control apparatus 4 also contains a saturation control circuit 8 between the control input 7 and the collector of the switching transistor 3.

The saturation control circuit 8 contains two diodes connected in series in the same sense, a low voltage diode 9 and a high voltage diode 10 suitable for high switching frequencies. The cathode of diode 10 is connected to the collector of the switching transistor 3 and the anode of diode 9 is connected by way of a preceding resistor 11 to the control input 7.

Between the junction of diodes 9 and 10, there is the anode of a diode 12 of which the cathode is connected to the positive pole of a 12 V low voltage source 2a which feeds the generator 5. Between the junction of resistor 11 and diode 9 and the base of the switching transistor 3, the base control circuit 6 contains a diode 13 and a current amplifier 14 in series. Diode 13 precedes the input of the current amplifier 14, its cathode being connected to the current amplifier input. The current amplifier 14 has a voltage amplification of '1' and serves to detect the control voltage without the base of the switching transistor 3 thereby markedly loading the generator 5. The source 2a also feeds the amplifier 14.

Between the input of the current amplifier 14 and the emitter of the switching transistor 3 there is also a resistor 15. Further, a diode 16 between the control input 7 and the current amplifier input has its cathode connected to the control input 7 and its anode connected to the current amplifier input.

When a positive half-wave of the control voltage occurs at the control input 7, it drives a current, the base current, through the base-emitter path of the switching transistor 3 by way of the resistor 11, the diode 13 and the current amplifier 14. The switching transistor 3 thereby becomes conductive. As soon as the collector potential (in relation to the potential of the emitter of the switching transistor 3 or the negative pole of the operating voltage source 2) is less than the potential of the junction between the resistor 11 and diode 9 by the sum of the threshold voltages of the diodes 9 and 10, the diodes 9 and 10 become conductive. The control voltage therefore drives an additional current through the resistor 11, the diodes 9 and 10 and the collector-emitter path of the switching transistor 3. Since the voltage drops at the diodes 9, 10 and 13 are substantially equal in the pass direction, whereas the voltage drop at the current amplifier 14 can be regarded as negligibly small (because of the voltage amplification '1'), the collector potential is lower than the base potential by the voltage drop of one of the diodes 9 and 10. In other words, the base-emitter voltage is higher than the collector-emitter voltage of the switching transistor 3 by the voltage drop of one diode (9 or 10). Since, on the diodes 9 and 10 becoming conductive, part of the current previously flowing through the base now flows through the diodes 9 and 10 and the collector-emitter path, or the potential of the junction between the resistor 11 and diode 9 decreases because of the voltage drop at the resistor 11 and at the internal resistance of the generator 5, the base current decreases so that the modulation of the switching transistor 3 is again somewhat reduced and the collector-emitter voltage rises correspondingly. This leads to blocking of the diodes 9 and 10 and a corresponding recurring rise in the base current. As a result, the operating point of the switching transistor 3 becomes stabilized so that its base-emitter voltage is higher than its collector-emitter voltage substantially by the pass voltage drop of one diode. This ensures that the switching transistor 3 is always controlled to saturation when switching on but not driven too far into saturation. It therefore exhibits low switching-on losses. Nevertheless, when the switching transistor 3 is switched off, there is comparatively rapid dissipation of the charge carriers stored in the base junction during saturation, because there is only limited saturation.

Since switching off is effected by means of a control voltage which is negative with respect to earth or the emitter potential and which acts practically in its entirety on the base of the switching transistor 3, the dissipation of charge carriers from the base junction of the saturated switching transistor 3 is more rapid than in the case of merely removing a positive switching-on control voltage. The result is all the more rapid switching off (blocking) of the switching transistor.

In relation to a positive switching-on control voltage, the resistors 11 and 15 have the effect of a voltage divider for adapting the control voltage to the desired modulation of the switching transistor 3.

The diodes 9 and 13 of which the pass voltage drops become compensated with respect to the collector-base voltage could be dispensed with (short-circuited) to achieve merely (low) saturation. However, the diode 9 is desirable if the switching transistor is to switch higher voltages than the blocking voltage of a normal diode. The blocking voltages of both diodes 9, 10 are together possibly sufficient for separating the operating voltage from the base. The diode 9 is also favourable when using a 'rapid' high voltage diode 10 as is required for switching a consumer 1 operated with a still higher voltage, e.g. a 380 V asynchronous motor operated from a voltage source of about 600 to 800 V by way of an inverse rectifier. Such a high voltage diode 10 has a comparatively high stray or switching capacitance which leads to the high positive voltage spikes or other high interference pulses at the collector of the switching transistor acting on the base of the switching transistor. The second diode 9 prevents this from happening, the diode 12 in addition ensuring that overvoltages occurring at the cathode of the diode 9 (particularly in the case of an inductive consumer) are returned to the operating voltage source 2 so that the diode 9 can be in the form of a simple low voltage diode.

When using the second diode 9 without the diode 13, the base-emitter voltage on switching-on of the switching transistor 3 would be higher than the collector-emitter voltage by the pass voltage drops of both diodes 9 and 10. This would drive the switching transistor 3 too far into saturation. The inclusion of diode 13 components the voltage drop at the diode 9 so that the difference between the collector and base potentials only corresponds to the pass voltage drop of diode 10.

When using one or more further diodes in the saturation control circuit 8 in series with diodes 9, 10 in the same sense to enable still higher voltages to be switched, two or more diodes connected in series in the same sense can be used instead of the one diode 13, whereby to compensate the voltage drop at the second diode and the or each further diode, so that the emitter potential is in each case higher than the collector potential relatively to earth (the emitter) by the voltage drop of only one diode of the saturation control circuit.

I claim:

1. A transistor circuit comprising a switching transistor having a base, collector and emitter, a load and a DC power supply in series with the collector-emitter path of said transistor, a control input terminal, a base circuit diode connected between said input and said base poled to conduct current in the same direction as the base-emitter junction of said transistor, a current amplifier connected between said base circuit diode and said base, a saturation control circuit connected between said input and said collector including first and second diodes in series poled to conduct current towards said collector, said diodes interacting so that upon a switch-on voltage being applied to said input the base-emitter voltage is higher than the collector-emitter voltage an amount approximating the difference between the voltage drop across said first and second diodes and the voltage drop across said base circuit diode.

2. A transistor circuit comprising a switching transistor having a base, collector and emitter, a load and a DC power supply in series with the collector-emitter path of said transistor, a control input terminal, a base circuit diode connected between said input and said base poled to conduct current in the same direction as the base-emitter junction of said transistor, a saturation control circuit connected between said input and said collector including first and second diodes in series poled towards said collector, an over-voltage diode connected between the junction of said first and second diodes and ground and being poled to conduct current towards ground, and a low voltage source connected between said over-voltage diode and ground poled to conduct current towards said over-voltage diode, said diodes interacting so that upon a switch-on voltage being applied to said input the base-emitter voltage is higher than the collector-emitter voltage an amount approximating the difference between the voltage drop across said first and second diodes and the voltage drop across said base circuit diode.

* * * * *